United States Patent
Krishtab et al.

(10) Patent No.: US 10,685,833 B2
(45) Date of Patent: Jun. 16, 2020

(54) SELECTIVE DEPOSITION OF METAL-ORGANIC FRAMEWORKS

(71) Applicants: IMEC VZW, Leuven (BE); Katholieke Universiteit Leuven, KU LEUVEN R&D, Leuven (BE)

(72) Inventors: Mikhail Krishtab, Heverlee (BE); Silvia Armini, Heverlee (BE); Ivo Stassen, Leuven (BE); Rob Ameloot, Diepenbeek (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 16/190,921

(22) Filed: Nov. 14, 2018

(65) Prior Publication Data

US 2019/0198391 A1   Jun. 27, 2019

(30) Foreign Application Priority Data

Dec. 21, 2017   (EP) .................................... 17209896

(51) Int. Cl.
*H01L 21/02* (2006.01)
*H01L 21/768* (2006.01)

(52) U.S. Cl.
CPC .... *H01L 21/0228* (2013.01); *H01L 21/02172* (2013.01); *H01L 21/02203* (2013.01); *H01L 21/02271* (2013.01); *H01L 21/76877* (2013.01)

(58) Field of Classification Search
CPC ........... H01L 21/0228; H01L 21/02203; H01L 21/02271; H01L 21/76877; H01L 21/02172; C23C 16/04
See application file for complete search history.

(56) References Cited

U.S. PATENT DOCUMENTS

| 6,794,287 B2 | 9/2004 | Saanila et al. |
| 8,614,144 B2 | 12/2013 | Kato |

(Continued)

FOREIGN PATENT DOCUMENTS

| EP | 2810950 A1 | 12/2014 |
| WO | 2015/166015 A1 | 11/2015 |

OTHER PUBLICATIONS

Stassen, Ivo et al., "Chemical Vapour Deposition of Zeolitic Imidazolate Framework Thin Films", Nature Materials, vol. 15, No. 3, Mar. 1, 2016, pp. 304-310.

(Continued)

*Primary Examiner* — Joseph C. Nicely
(74) *Attorney, Agent, or Firm* — McDonnell Boehnen Hulbert & Berghoff LLP

(57) ABSTRACT

Example embodiments relate to selective deposition of metal-organic frameworks. One embodiment includes a method of forming a low-k dielectric film selectively on exposed dielectric locations in a substrate. The method includes selectively depositing a metal-containing film, using an area-selective deposition process, on the exposed dielectric locations using one or more deposition cycles. The method also includes providing, at least once, a vapor of at least one organic ligand to the deposited metal-containing film resulting in a gas-phase chemical reaction thereby obtaining a metal-organic framework which is the low-k dielectric film. The low-k dielectric film has gaps on locations where no metal-containing film was deposited.

14 Claims, 4 Drawing Sheets

(56) References Cited

U.S. PATENT DOCUMENTS

| | | | |
|---|---|---|---|
| 8,992,792 | B2 | 3/2015 | Chang et al. |
| 9,586,170 | B2 | 3/2017 | Inubushi et al. |
| 9,613,859 | B2 | 4/2017 | Lakshmanan et al. |
| 9,640,428 | B2 | 5/2017 | Chi et al. |
| 9,666,528 | B1 | 5/2017 | Bergendahl et al. |
| 9,751,074 | B2 | 9/2017 | Kim et al. |
| 10,094,020 | B2 * | 10/2018 | Stassen .............. H01L 21/02172 |
| 2008/0197513 | A1 | 8/2008 | Restaino et al. |
| 2015/0221519 | A1 * | 8/2015 | Marks ................. G03F 7/70808 430/5 |
| 2016/0032455 | A1 | 2/2016 | Liu et al. |
| 2017/0098606 | A1 | 4/2017 | Lu et al. |
| 2018/0198006 | A1 * | 7/2018 | Greer ................ H01L 31/02363 |
| 2018/0233350 | A1 * | 8/2018 | Tois ................... H01L 21/02181 |
| 2018/0330963 | A1 * | 11/2018 | Tapily .................. H01L 21/471 |
| 2019/0164758 | A1 * | 5/2019 | Su ....................... H01L 21/3105 |

OTHER PUBLICATIONS

Stassen, Ivo et al., "An Updated Roadmap for the Integration of Metal-Organic Frameworks With Electronic Devices and Chemical Sensors", Chemical Society Reviews, vol. 46, No. 11, Jan. 1, 2017, pp. 3185-3241.

Stassen, Ivo et al., "Vapor-Phase Deposition and Modification of Metal-Organic Frameworks: State-of-the-Art and Future Directions", Chemistry—A European Journal, vol. 22, No. 41, Oct. 4, 2016, pp. 14452-14460.

Levy, David H. et al., "Metal-Oxide Thin-Film Transistors Patterned by Printing", Applied Physics Letters, vol. 103, No. 4, Jul. 22, 2013, pp. 043505-1-043505-4.

Levy, David H. et al., "Oxide Electronics by Spatial Atomic Layer Deposition", Journal of Display Technology, vol. 5, No. 12, Dec. 1, 2009, pp. 484-494.

Kang, Byung-Chang et al., "Selective Deposition of Hafnium Oxide Nanothin Films on OTS Patterned Si(100) Substrates by Metal-Organic Chemical Vapor Deposition", IEEE Transactions on Nanotechnology, vol. 5, No. 6, Nov. 1, 2006, pp. 701-706.

European Search Report, European Patent Application No. 17209896.4, dated Jun. 7, 2018, 12 pages.

Usman, Muhammad et al., "Metal Organic Frameworks: The Future of Low-k Materials", NPG Asia Materials, vol. 8, 2016, pp. 1-2.

Mendiratta, Shruti et al., "Metal-Organic Frameworks for Electronics: Emerging Second Order Nonlinear Optical and Dielectric Materials", Science and Technology of Advanced Materials, vol. 16, 2015, pp. 1-7.

Usman, Muhammad et al., "Intrinsic Low Dielectric Behaviour of a Highly Thermal Stable Sr-Based Metal-Organic Framework for Interlayer Dielectric Materials", Journal of Materials Chemistry, vol. 2, 2014, pp. 3762-3768.

Eslava, Salvador et al., "Metal-Organic Framework ZIF-8 Films as Low-k Dielectrics in Microelectronics", Chemistry of Materials, vol. 25, 2013, pp. 27-33.

Vanstreels, K et al., "Mechanical Stability of Porous Low-k Dielectrics", ECS Journal of Solid State Science and Technology, vol. 4, No. 1, 2015, pp. N3058-N3064.

\* cited by examiner

SELECTIVE DEPOSITION OF METAL-ORGANIC FRAMEWORKS

CROSS-REFERENCE TO RELATED APPLICATIONS

The present application is a non-provisional patent application claiming priority to European Patent Application No. EP 17209896.4, filed Dec. 21, 2017, the contents of which are hereby incorporated by reference.

FIELD OF THE DISCLOSURE

The present disclosure is related to the field of semiconductor structures and methods for forming these structures. More specifically it is related to methods of forming a low-k dielectric structure selectively on exposed dielectric locations in a substrate. The present disclosure also relates to a substrate structure having dielectric regions covered with a low-k dielectric film and to semiconductor devices comprising such structures.

BACKGROUND

Feature dimensions in advanced interconnects approach 20 nm and below, and therefore the precise alignment of adjacent metallization layers connected by vias becomes critical for the reliability of Ultra Large Scale Integration (ULSI) devices. One of the key issues of via pitch downscaling is the increasing impact of the overlay error defined by the lithography step. Since the required overlay downscaling presents a great challenge by itself, alleviation of this requirement should be done by revising the present patterning schemes.

Overlay error down-scaling is rather slow and does not meet the tolerance for the quickly shrinking via dimensions which creates reliability concerns for the correct via placement. While there are several self-aligned schemes proposed, involving area-selective deposition processes via atomic layer deposition (ALD), one of the key issues in such schemes is that so far there are no defined approaches for selective deposition of low-k dielectric films (k-value below 3.9—that of silicon oxide). Therefore the DoD (dielectric on dielectric) selective deposition is typically done employing high-k dielectrics such as ALD $AlO_x$, $HfO_x$, $ZrO_x$, etc. These dielectrics have k-values above 9 which increases the overall RC-delay of interconnects upon their integration in the metallization layers as inter-metal dielectrics at the via level. Additionally, the finite selectivity of the area-selective deposition ALD processes results in formation of defects such as nucleation of dielectric phase on top of metal lines. This limits the thickness of the ALD dielectric which can be grown selectively (selectivity window) while the presence of defects may induce increased resistance of via contacts.

There is therefore a need for methods of forming a low-k dielectric structure selectively on exposed dielectric locations in a substrate and for substrate structures having dielectric regions covered with a low-k dielectric film and for semiconductor devices comprising such structures.

SUMMARY

Example embodiments provide methods for forming a low-k dielectric structure selectively on exposed dielectric locations in a substrate and for providing substrate structures having dielectric regions covered with a low-k dielectric film and for providing semiconductor devices comprising such structures.

In a first aspect, embodiments relate to a method of forming a low-k dielectric film selectively on exposed dielectric locations in a substrate. The method comprises:
  depositing a metal-containing film using an area-selective deposition process selectively on the exposed dielectric locations using one or more deposition cycles,
  providing at least once a vapor of at least one organic ligand to the deposited metal-containing film resulting in a gas-phase chemical reaction thereby obtaining a metal-organic framework which is the low-k dielectric film wherein the low-k dielectric film has gaps on locations where no metal-containing film was deposited.

In some embodiments, the resulting metal-organic framework may be a low-k dielectric. Thus low-k dielectric on dielectric growing is possible. This method may for example be used for forming interconnects with a metal in the substrate which is located between dielectric locations in the substrate. These interconnects are then located in the gaps in the low-k dielectric film. As this film is a low-k dielectric film the eventual capacitances and hence also the eventual RC-constants will be smaller than in case a high-k dielectric would have been formed on the exposed dielectric locations.

In some embodiments, a metal-containing film is grown on top of another dielectric after which it is converted into a metal-organic framework (MOF) by providing at least once a vapor of organic ligands. In some embodiments, only a thin metal-containing film (e.g. <5 nm) may be used because of the volume expansion of the metal-containing film when converting it into a MOF. In some embodiments, the selectivity requirement for the deposition of the metal-containing film may be significantly reduced.

In some embodiments, by forming the MOF, the porosity may be increased compared to the initially deposited metal-containing film as this results in a decrease of the k-value. Thus a low-k dielectric film can be obtained on the dielectric locations.

In some embodiments, the MOFs crystallize during the exposure to organic linkers. Thus, in some embodiments, crystals may be obtained which align with the edges of the dielectric locations on which the MOF is formed and therefore no critical dimension (CD) loss occurs during the anisotropic growth of the MOF. This is particularly the case because the organic ligands are provided in the gas phase. Thus building blocks of coordinated metal ions, which are created by adding the organic linkers, will have short diffusion length as there is no or very limited amount of solvent. Thus a low-k dielectric film can be selectively deposited on exposed dielectric locations.

In some embodiments, the area-selective deposition process is an ALD process.

In some embodiments, the metal-containing film is deposited such that it comprises at least one metal ion or a cluster of metal ions from the group consisting of Zn, Fe, In, Co, Cu, Mn, Li, B, Cd, Hg, Mg, Al, Zr, Hf, Ti, Ta, and Pr.

In some embodiments, depositing the metal-containing film comprises exposing the metal-containing film to an oxidizing agent thereby forming a metal-oxide.

In some embodiments, the metal-oxide may for example comprise one or more of the following elements: $AlO_x$, $ZrO_x$, $HfO_x$, ZnO, $CoO_x$, or any other oxide of a metal of the group consisting of Zn, Fe, In, Co, Cu, Mn, Li, B, Cd, Hg, Mg, Al, Zr, Hf, Ti, Ta, and Pr.

In some embodiments, the at least one ligand is azole-based.

In some embodiments, the at least one ligand is a carboxylic acid.

In some embodiments, the number of deposition cycles is fewer than 150 or even fewer than 10.

Every deposition cycle may comprise an ALD deposition step followed by an oxidizing step.

Methods according to embodiments may further comprise the following steps:

applying an etch stop layer over the low-k dielectric film and over metal contacts in between the dielectric locations, depositing a gap-filling, low-k dielectric over the etch stop layer such that the gap-filling, low-k dielectric fills the gaps in the low-k dielectric film, covering the gap-filling, low-k dielectric with a hard mask, patterning the hard mask, the gap-filling, low-k dielectric and the etch stop layer such that at least one opening is created towards the metal contacts, applying a metallization layer resulting in at least one via in contact with the metal contact.

In some embodiments, vias can be formed in the gaps in the low-k dielectric film by patterning and by applying a metallization layer. As the low-k dielectric film is achieved by anisotropic growth of the MOF no CD loss occurs and thus space of the gap where the vias will be deposited is not decreased. The low-k dielectric film is in this case forming an inter-layer low-k dielectric at the via level of the metallization layer.

After the passivation with an etch-stop layer and deposition of gap-filling, low-k dielectric, the via pattern is sequentially transferred into these layers in a self-aligned fashion thus alleviating the demands for the lithography overlay tolerance.

In some embodiments, the low-k dielectric film thus serves as an inter-layer low-k dielectric at the via level of the metallization layer. In some embodiments, this inter-layer is a low-k dielectric as this decreases the eventual capacitance and RC delay.

In some embodiments, interconnects with feature dimensions down to 40 nm, or even 20 nm or even 10 nm can be created. This is achieved through self-aligned via patterning with selective formation of metal-organic frameworks as low-k inter-metal dielectric at the via level.

In a second aspect, embodiments relate to a substrate structure comprising: a substrate having a main surface comprising metal regions and dielectric regions, wherein the dielectric regions are covered with a low-k dielectric film and wherein gaps are present in the low-k dielectric film on locations of the metal regions and wherein the low-k dielectric film is a metal-organic framework.

In some embodiments, the low-k dielectric film has a thickness range between 1 nm and 250 nm.

In some embodiments, the k-value of the low-k dielectric film is below 4.

In some embodiments, at least one of the gaps is filled with a metal thus forming a via in contact with the underlying metal region.

In some embodiments, the low-k dielectric film is covered with a gap-filling low-k dielectric comprising a pattern for electrical contacting at least one metal region through the at least one via.

In a third aspect, embodiments relate to a semiconductor device comprising a substrate structure, according to embodiments, for interconnecting individual devices of the semiconductor device.

Particular aspects are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

Figure 1:
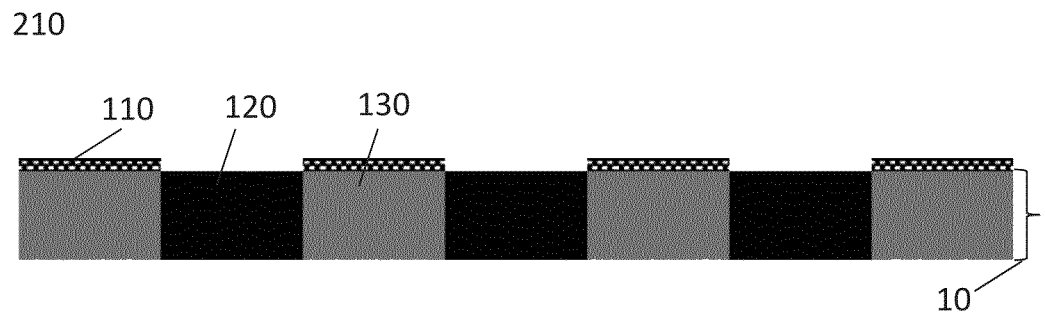
FIG. 1 shows a cross-section of a substrate structure that is obtained after depositing a metal-containing film, according to example embodiments.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures, and techniques have not been shown in detail in order not to obscure an understanding of this description.

Where, in embodiments, reference is made to a low-k dielectric, reference is made to a dielectric with a k-value below 4 or even below 3.9. The k-value may for example be between 2 and 3, for example around 2.5.

In a first aspect, embodiments relate to a method 200 of forming a low-k dielectric film 140 selectively on exposed dielectric locations 130 in a substrate 10. Different possible steps of such a method are illustrated by the flow chart in FIG. 7. FIGS. 1-6 illustrate portions of integrated circuit layers representing various steps of a method according to example embodiments.

A method 200 in accordance with embodiments comprises a step for depositing 210 a metal-containing film 110 using an area-selective deposition (ASD) process selectively on the exposed dielectric locations 130 using one or more deposition cycles. FIG. 1 shows a cross-section of an example substrate structure which is obtained after this deposition step. It shows metal contacts 120 (e.g. Cu, Co, Ru, W) in between dielectric locations 130 (e.g. $SiO_2$) and a metal-containing film 110 (e.g. ZnO, $ZrO_x$) on the exposed dielectric locations 130.

A method 200 in accordance with embodiments furthermore comprises providing 220 at least once a vapor of at least one organic ligand to the deposited metal-containing film 110 resulting in a gas-phase chemical reaction thereby obtaining a MOF 140 which is the low-k dielectric film 140 wherein the low-k dielectric film 140 has gaps 142 on locations where no metal-containing film was deposited. As a result of the chemical reaction, the metal-containing film 110 is consumed and transformed into an anisotropic layer of a metal-organic framework 140. Vapor phase precursors may be compatible with CMOS processing. In some embodiments, by providing 220 at least once a vapor of at least one organic ligand to the deposited metal-containing film 110 resulting in a gas-phase chemical reaction thereby obtaining a MOF, the metal-containing film 110 is converted into a MOF which has a low-k value. By adding the precursor the metal-containing film expands and becomes porous resulting in a low-k MOF. Volume expansions in the range of 5-20 are possible. The metal-containing film may for example be thinner than 5 nm, thinner than 2 nm, or even 1 nm or thinner. For example, a metal-containing film with a thickness of 1 nm may result in a MOF with a thickness of 20 nm. A MOF thickness of 250 nm may be achieved. As the thickness requirement of the metal-containing film is limited, only a limited number of deposition cycles may be used.

In some embodiments, the organic ligands are provided in the gas phase. Thus building blocks of coordinated metal ions, which are created by adding the organic linkers, will have short diffusion length as there is no or very limited amount of solvent. In some conversion processes the by-products of the reaction are water or alcohols. Though they predominantly may evaporate during the conversion, they may play a role in assembly of the metal-organic framework layer. In some embodiments, the ligand may be azole-based. In some embodiments, the ligand may be a carbolic acid.

In a second aspect, embodiments relate to a substrate structure 100 comprising a substrate 10 having a main surface comprising metal regions 120 and dielectric regions 130 wherein the dielectric regions 130 are covered with a low-k dielectric film 140 and wherein gaps 142 are present in the low-k dielectric film on locations of the metal regions 120 and wherein the low-k dielectric film 140 is a metal-organic framework. By material analysis it is possible to distinguish this low-k MOF from a high-k dielectric. In alternate substrate structures, a high-k dielectric may cover the dielectric regions 130.

Figure 2:
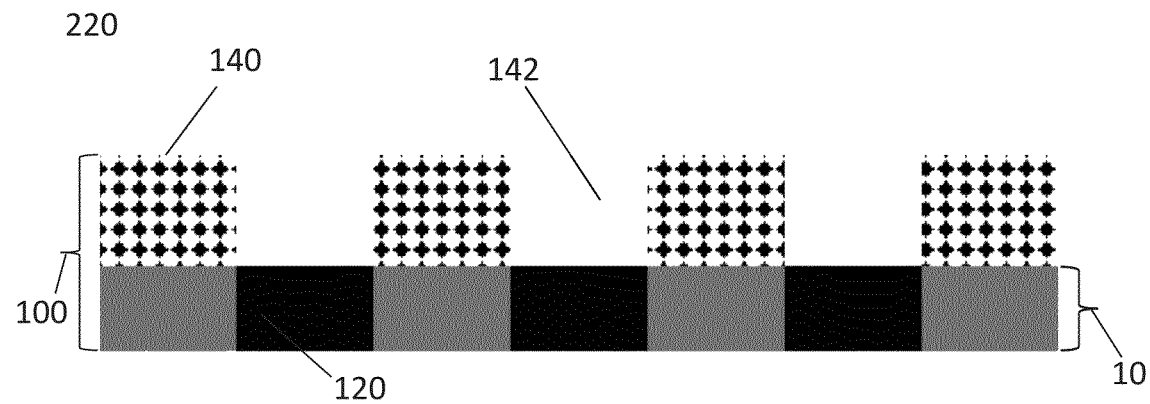
FIG. 2 shows a cross-section of a substrate structure that is obtained after the gas phase conversion step, according to example embodiments.

FIG. 2 shows a cross-section of a substrate structure 100, according to example embodiments. This substrate structure 100 is obtained after the gas phase conversion step 220. It shows the low-k dielectric film 140 which is a selective and anisotropic MOF layer. It also shows the gaps 142 on locations where no metal-containing film was deposited. The selective formation of metal-organic frameworks is realized via conversion of the selectively grown metal-containing film 110 (e.g. $AlO_x$, $ZrO_x$, $HfO_x$, ZnO, $CoO_x$, etc.) into nanoporous and crystalline metal-organic framework phase upon its exposure to vapors of appropriate organic ligands. The area selective deposition process may for example be an atomic layer deposition process or a molecular layer deposition process.

Since, in some embodiments, ultra-low-k values might not be used (i.e. it is in some cases sufficient to have a k value below 4) the metal-organic framework may not necessarily be crystalline. Non-crystalline or nanocrystalline metal-organic frameworks may be sufficient.

In some embodiments, the k-value of the low-k dielectric film may be below 4. In some embodiments, the MOF is a microporous dielectric. The dielectric constant may vary depending on the composition of the framework and its topology (and on the presence or absence of guest molecules in the pores). Examples of MOFs with a k-value below 4 are amongst others: MOF-5, HKUST-1, ZIF-8, ZIF-67.

With regard to the area-selective deposition, the MOF 140 may not react with the exposed metal in the metal regions 120 (e.g. the metal lines). In some embodiments, the CVD MOF process is compatible with SAM (Self-Assembled Monolayer)/polymer passivation of the metal in the metal regions 120 as this already happens for ASD ALD metal oxide. The interaction between the organic ligands and the metal surface of the metal regions 120 may for example be prevented by SAMs/polymer passivation which remains after ASD of the metal containing film. However, the interaction between the exposed metal and the organic linker is not a necessary condition for the successful and selective conversion process. It will depend on a particular pair of exposed/oxidized metal and organic linker as well as on the conversion conditions (e.g. temperature). If there is no (bulk) chemical reaction between a metal surface and an organic ligand under conversion conditions, the conversion can be termed compatible with the proposed scheme. Therefore, compatibility can be achieved either by selecting an organic ligand, reaction of which with exposed metal surface is not thermodynamically favorable, or reaction of which with the exposed metal surface can be sterically prevented by the SAMs/polymer passivation inherited form the preceding ASD step. The temperature of the conversion process may be as low as 100° C. (and even lower, e.g. as low as 80° C.), which is compatible for a wide range of commonly employed SAMs/polymer passivation layers. For example in case of Zn-based MOF ZIF-8 the lowest boundary of the conversion temperature for MOF formation may be as low as 100° C., and even as low as 80° C.

WO2015/166015 aims to solve the problems associated with solvent-based solutions for forming MOF films by using vapor phase precursors instead.

Methods according to example embodiments may be applied in a self-aligned via patterning approach wherein metal-organic frameworks 140 are used as low-k inter-metal dielectric and are selectively formed at the via level of the metallization layer.

In the context of interconnects applications, the target thickness of the selectively grown low-k dielectric 140 is in the range 10-100 nm. Even a thickness of 250 nm may be wanted for relatively large pitch dimensions. This thickness range can be realized by depositing the thin metal-containing precursor film 110 (e.g. less than 5 nm, less than 2 nm, or even 1 nm or less) wherein the thickness of metal-containing precursor film depends on the metal ion density in the precursor film and volume expansion of a particular metal-organic framework.

Figure 3:
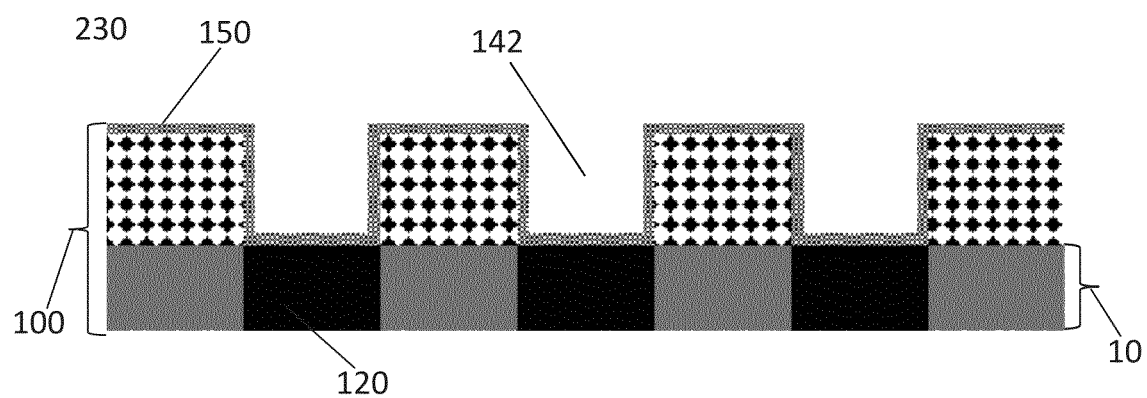
FIG. 3 shows a cross-section of a substrate structure that is obtained after applying the etch stop layer, according to example embodiments.

Methods according to example embodiments may comprise applying 230 an etch stop layer 150 over the low-k dielectric film 140 and over metal contacts 120 in between the dielectric locations 130. FIG. 3 shows a cross-section of a substrate structure 100, according to example embodiments. This substrate structure 100 is obtained after applying the etch stop layer 150. It shows the etch stop layer 150 (e.g. $SiN_x$) over the low-k dielectric film 140 and over metal contacts 120.

Figure 4:
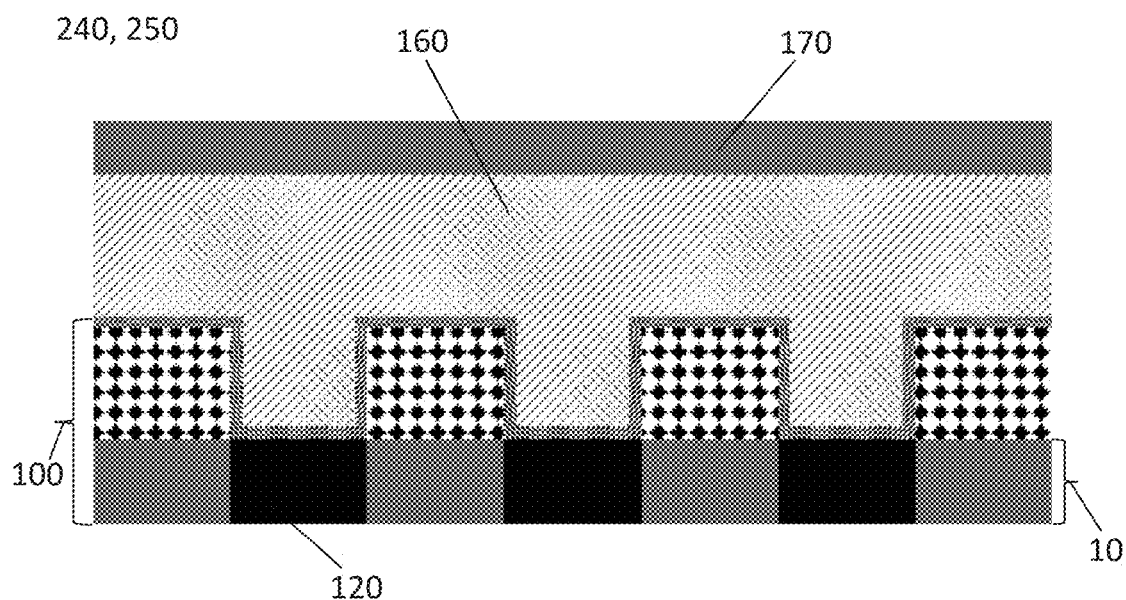
FIG. 4 shows a cross-section of a substrate structure that is obtained after depositing a gap-filling, low-k dielectric and after covering the gap-filling, low-k dielectric with a hard mask, according to example embodiments.

Methods according to example embodiments may moreover comprise depositing 240 a gap-filling, low-k dielectric 160 over the etch stop layer 150 such that the gap-filling, low-k dielectric 160 fills the gaps 142 in the low-k dielectric film. This step may be followed by a step covering 250 the gap-filling, low-k dielectric 160 with a hard mask 170. FIG. 4 shows a cross-section of a substrate structure 100, according to example embodiments. This substrate structure 100 is obtained after depositing 240 a gap-filling, low-k dielectric 160 and after covering the 250 gap-filling, low-k dielectric 160 with a hard mask 170.

After the passivation with etch stop layer 150 and deposition of gap-filling low-k dielectric 160, the via pattern is sequentially transferred into these layers in a self-aligned fashion thus alleviating the demands for the lithography overlay tolerance.

Figure 5:
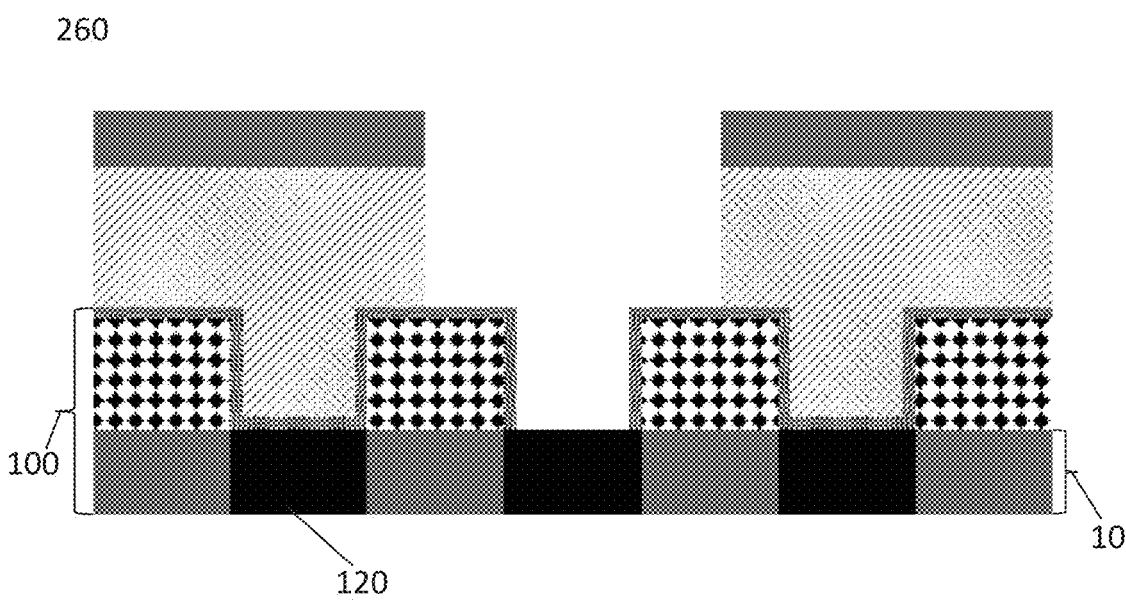
FIG. 5 shows a cross-section of a substrate structure that is obtained after applying the patterning step, according to example embodiments.

Methods according to example embodiments may therefore comprise patterning 260 the hard mask 170, the gap-filling, low-k dielectric 160 and the etch stop layer 150 such that at least one opening is created towards the metal contacts 120. FIG. 5 shows a cross-section of a substrate structure 100 after applying the patterning step.

Figure 6:
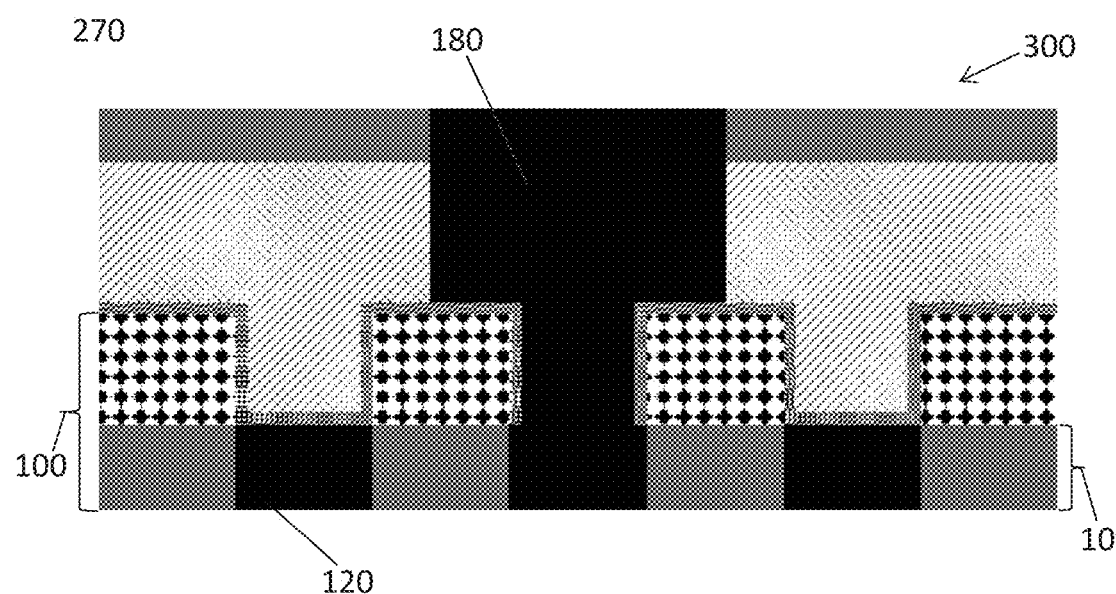
FIG. 6 shows a cross-section of a substrate structure that is obtained after applying the metallization layer, according to example embodiments.

Methods according to example embodiments may moreover comprise applying 270 a metallization layer resulting in at least one via 180 in contact with the metal contact. FIG. 6 shows a cross-section of a substrate structure 100 after applying the metallization layer 180. Thus a complete metallization layer N+1 (after chemical mechanical planarization) on a metallization layer N may be obtained.

These method steps according to example embodiments may be implemented as a self-aligned patterning scheme in the back-end-of-line processing.

Figure 7:
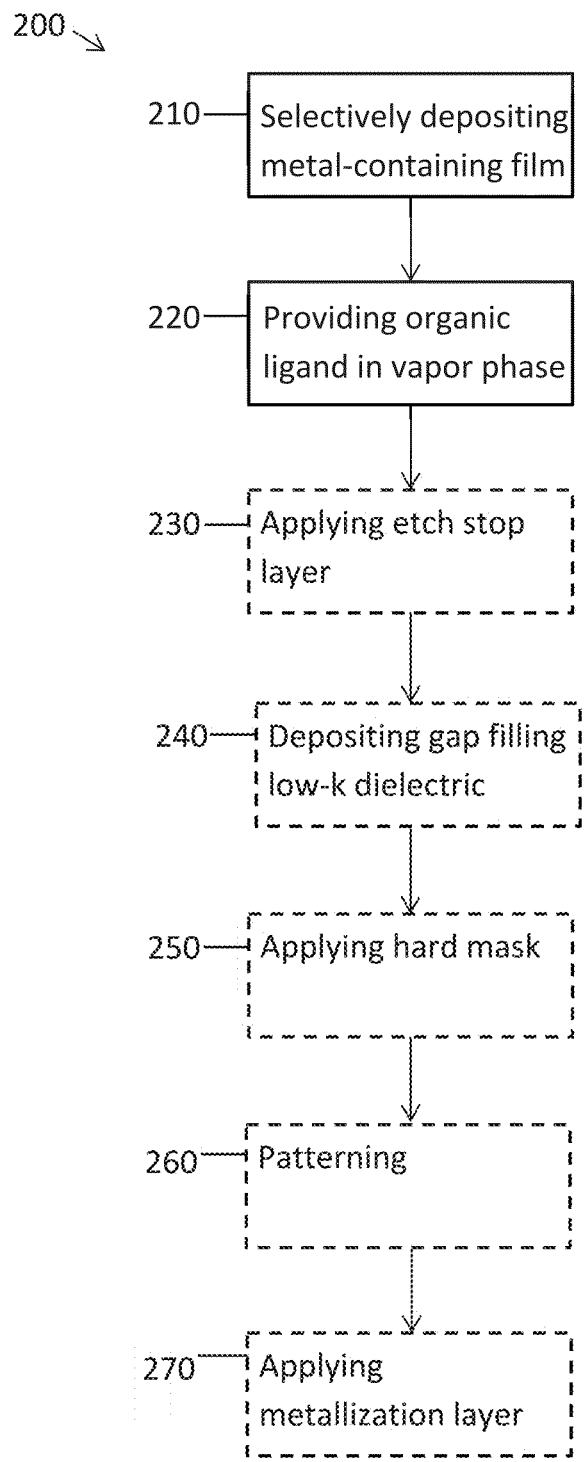
FIG. 7 shows a flow chart of method steps, according to example embodiments.

FIG. 7 shows different possible steps of a method according to example embodiments. It shows a step 210 selectively depositing a metal-containing film using one or more deposition cycles followed by a step 220 providing at least once a vapor of at least one organic ligand. Each of the steps may be executed more than once. The sequence of depositing 210 the metal-containing film and providing 220 the vapor may also be executed in cycles. FIG. 7 also shows the optional steps 230-270.

In some embodiments, the formed metal-organic framework 140 has the outstanding combination of very low dielectric constant (even below 2.5) and relatively high Young's modulus (MOFs possess a wide range of YM-values from 1 GPa and below up to 20 GPa and above).

In some embodiments, volume expansion accompanying the conversion of the metal-containing film 110 into metal-organic frameworks 140 may alleviate a selectivity used for the area-selective deposition process since a limited amount of selectively deposited metal precursor is used to form thick porous material compared to alternative methods that typically include depositing high-k dielectric films on the exposed dielectric locations.

In some embodiments, a wide range of different MOFs can be formed by combining different transition metal-precursor films and organic ligands (examples of particularly interesting transition metals for application of MOFs in interconnects are: Zn, Al, Hf, Zr, Sr, Co, Cu, Ni).

In summary, a method according to example embodiments is based on sequential ASD of a metal-containing film 110 on exposed dielectric locations wherein a MOF 140 is formed by successive gas-phase chemical reaction between the metal-containing film 110 and vapor of organic ligands. The exposed dielectric locations may be low-k dielectric locations.

In a third aspect, embodiments relate to a semiconductor device comprising a substrate structure according to example embodiments. The substrate structure may for example be part of the BEOL structure. The metal-organic framework may thereby serve as an inter-layer low-k dielectric at the via level of the metallization layer.

What is claimed is:

1. A method of forming a low-k dielectric film selectively on exposed dielectric locations in a substrate, the method comprising:
   selectively depositing a metal-containing film, using an area-selective deposition process, on the exposed dielectric locations using one or more deposition cycles; and
   providing, at least once, a vapor of at least one organic ligand to the deposited metal-containing film resulting in a gas-phase chemical reaction thereby obtaining a metal-organic framework which is the low-k dielectric film, wherein the low-k dielectric film has gaps on locations where no metal-containing film was deposited.

2. The method according to claim 1, wherein the area-selective deposition process is an atomic layer deposition process.

3. The method according to claim 1, wherein the metal-containing film is deposited such that it comprises at least one metal ion or a cluster of metal ions selected from the group consisting of: Zn, Fe, In, Co, Cu, Mn, Li, B, Cd, Hg, Mg, Al, Zr, Hf, Ti, Ta, and Pr.

4. The method according to claim 1, wherein depositing the metal-containing film comprises exposing the metal-containing film to an oxidizing agent thereby forming a metal-oxide.

5. The method according to claim 1, wherein the at least one organic ligand is azole-based.

6. The method according to claim 1, wherein the at least one organic ligand is a carboxylic acid.

7. The method according to claim 1, wherein the one or more deposition cycles comprises 150 or fewer deposition cycles.

8. The method according to claim 1, further comprising:
   applying an etch stop layer over the low-k dielectric film and over metal contacts in between the exposed dielectric locations;
   depositing a gap-filling, low-k dielectric over the etch stop layer such that the gap-filling, low-k dielectric fills the gaps in the low-k dielectric film;
   covering the gap-filling, low-k dielectric with a hard mask;
   patterning the hard mask, the gap-filling, low-k dielectric, and the etch stop layer such that at least one opening is created towards the metal contacts; and
   applying a metallization layer resulting in at least one via in contact with at least one of the metal contacts.

9. A method of forming a semiconductor device comprising a substrate structure by forming a low-k dielectric film selectively on exposed dielectric locations in a substrate, wherein the substrate structure is configured to interconnect individual devices of the semiconductor device, and wherein the method comprises:
   selectively depositing a metal-containing film, using an area-selective deposition process, on the exposed dielectric locations using one or more deposition cycles; and
   providing, at least once, a vapor of at least one organic ligand to the deposited metal-containing film resulting in a gas-phase chemical reaction thereby obtaining a metal-organic framework which is the low-k dielectric film, wherein the low-k dielectric film has gaps on locations where no metal-containing film was deposited.

10. The method according to claim 9, wherein the area-selective deposition process is an atomic layer deposition process.

11. The method according to claim 9, wherein the metal-containing film is deposited such that it comprises at least one metal ion or a cluster of metal ions selected from the group consisting of: Zn, Fe, In, Co, Cu, Mn, Li, B, Cd, Hg, Mg, Al, Zr, Hf, Ti, Ta, and Pr.

12. The method according to claim 9, wherein depositing the metal-containing film comprises exposing the metal-containing film to an oxidizing agent thereby forming a metal-oxide.

13. The method according to claim 9, wherein the at least one organic ligand is azole-based.

14. The method according to claim 9, wherein the at least one organic ligand is a carboxylic acid.

* * * * *